United States Patent [19]

Liu et al.

[11] Patent Number: 5,075,194
[45] Date of Patent: Dec. 24, 1991

[54] POSITIVE PHOTORESIST COMPOSITION CONTAINING 4,4-DIESTER, 4,5-DIESTER, OR 5,5-DIESTER OF SPIROGLYCOL AND 1-OXO-2-DIAZONAPHTHALENE-5-SULFONIC ACID CHLORIDE

[75] Inventors: Jong M. Liu, Hsinchu; Chao H. Tzeng, Taipei, both of Taiwan

[73] Assignee: Industrial Technology Research Institute, Hsinchu, Taiwan

[21] Appl. No.: 462,650

[22] Filed: Jan. 9, 1990

[51] Int. Cl.$^5$ .................. G03C 1/52; G03C 1/56
[52] U.S. Cl. .................. 430/191; 430/165; 430/192; 430/193
[58] Field of Search ............. 430/191, 192, 193, 165

[56] References Cited

U.S. PATENT DOCUMENTS

| 3,046,118 | 7/1962 | Schmidt . | |
| 3,148,983 | 9/1964 | Endermann et al. . | |
| 3,402,044 | 9/1968 | Steinhoff et al. . | |
| 4,115,128 | 9/1978 | Kita . | |
| 4,173,470 | 11/1979 | Fahrenholtz et al. | 430/5 |
| 4,397,937 | 8/1983 | Clecak et al. | 430/192 |
| 4,550,069 | 10/1985 | Pampalone | 430/165 |
| 4,551,409 | 11/1985 | Gulla et al. | 430/192 |
| 4,596,763 | 6/1986 | DiCarlo et al. | 430/326 |
| 4,737,437 | 4/1988 | Gutsell et al. | 430/168 |
| 4,738,915 | 4/1988 | Komine et al. | 430/191 |
| 4,883,739 | 11/1989 | Sakaguchi et al. | 430/191 |

FOREIGN PATENT DOCUMENTS 0092444 10/1983 European Pat. Off. .

Primary Examiner—Charles L. Bowers, Jr.
Assistant Examiner—Christopher G. Young
Attorney, Agent, or Firm—Scully, Scott, Murphy & Presser

[57] ABSTRACT

A positive photoresist composition and formulation comprising a resin matrix and a photosensitizer obtained from 1-oxo-2-diazo naphthalene-4-sulfonic acid chloride, on 1-oxo-2-diazo naphthalene-5-sulfonic acid chloride and spiroglycol to form 4,4-diester or 5,5-diester.

7 Claims, 2 Drawing Sheets

POSITIVE PHOTORESIST COMPOSITION CONTAINING 4,4-DIESTER, 4,5-DIESTER, OR 5,5-DIESTER OF SPIROGLYCOL AND 1-OXO-2-DIAZONAPHTHALENE-5-SULFONIC ACID CHLORIDE

BACKGROUND OF THE INVENTION

The present invention relates to the composition and formulation of a photoresist material for microimaging, characterized by a novel photosensitizer which performs better in enhancing the resolution of photoresist than commercially available ones presently. Essentially, micro-imaging process comprises coating a thin film of a photoresist containing a resin matrix and a photosensitizer onto a substrate; imagewise exposing through a photomask the film to initiate photochemical reaction in the film, and developing the microimage by dissolving and washing away the portion where photoresist either has or has not undergone photochemical reaction, as the case may be. A photoresist is of positive type if it can be washed away by a developer where it has been exposed to light. It is of negative type if it can be washed where it has not been exposed to light.

Due to the higher resolution and better thermostability positive photoresist compositions can offer, they are becoming the predominant of the above two types of photoresists in the manufacturing of miniaturized electronic components and micro-image production. The two major components of positive photoresist compositions are a resin matrix and a photosensitizer which are blended to form the compositions. The resin matrix is generally a copolymer of cresol and formaldehyde, and is called novolak, and is soluble in common organic solvents and alkaline solutions. Photosensitizers used for positive photoresist are naphthoquinone diazide derivatives. The coated film made from novolak and 15 to 30% by weight of such a photosensitizer dissolves much more slowly in an alkaline solution than films of novolak alone. However, if these photosensitizers are exposed to actinic radiation, the photochemical reaction transforms it into a carboxylic product which is more soluble in alkaline solution. The reaction is illustrated as follows;

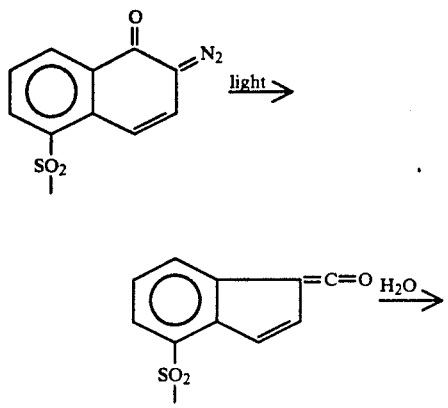

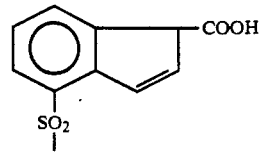

The photochemical mechanism for the sensitizer was proposed by Süs (1944). Upon reacting with light, the quinone diazides form ketene intermediate and converts to carboxylic acid group which is base soluble. In unexposed area, a chemical reaction called "coupling" occurs instantly in alkaline developing solutions, which also remove the exposed residues. This photochemically generated difference in dissolution rate in alkaline developing solution is made use of by the production of micro-images. The chemistry of photoresist material and the production of micro-images have been described in the book "Photoresist Materials and Processes," by De Forest, W. S., McGraw Hill Book Company, N.Y., 1975, which is incorporated herein by reference.

U.S. Pat. Nos. 3,046,118, 3,148,983, 3, 3,402,044, 4,115,128, 4,173,470, 4,550,069, 4,551,409, Japan Patent Nos. 60-134235, 60-138544, 60-143355, 60-154248, 60-164740, 60-176034 and European Patent Application No. 0,092,444 disclose naphthoquinone diazide photosensitizers, such as 1-oxo-2-naphthoquinone-5-sulfonic acid chloride, 1-oxo-2-naphthoquinone-4-sulfonic acid chloride, and the esterified condensate of trihydroxybenzophenone for micro-image production.

One drawback of conventional photoresist compositions containing novolak resins and naphthoquinone diazide photosensitizer useful in the near UV spectral region 360–450nm) is that it shows low sensitivity when utilized in mid-uv region (300–350nm). This adversely affects wafer throughput. Due to low optical absorption or incomplete bleachability of the sensitizer, the photochemical product possesses inefficient transparency. Therefore photo reaction cannot be effected at the bottom layer of the resist and well-defined patterns can hardly be obtained.

FIG. 1 shows the absorption spectrum for AZ1350 J photoresist, available from American Hoechst Corporation, before and after bleaching. It indicates that there is no photobleaching effect after exposing at wavelength 313 nm which is the major component in the mid UV region, and as a result it is not suitable for exposure in mid-UV light.

In view of the fast development of higher circuitry density in miniaturized electronic devices, in order to increase the resolution in forming microimages, i.e. to reduce the line width, the most important method is to expose the photoresist by decreasing the wavelength of the incident irradiation. For example, exposures with mid-UV radiation source of wavelength 313 nm can achieve this object. A reduction in the exposure wavelength from near UV to mid-UV at 313 nm would substantially increase the resolution.

Due to the lack of sensitivity for conventional photoresist in the mid UV region, especially at 313 nm, the employing of a shorter wavelength radiation so as to increase image resolution cannot be achieved. Currently, mid-UV photoresists have already been developed, such as 2,3,4-trihydroxybenzophenone and 1-oxo- 2-napthoquinone-4-sulfonic acid triester which are disclosed in U.S. Pat. No. 4,596,763 and 4-benzyl-1,2,3-trihydroxybenzene and 1-oxo-2-diazo-naphthalene-5-sulfonic acid ester which is disclosed in U.S. Pat. No. 4,737,437.

SUMMARY OF THE INVENTION

It is the object of the present application to provide a positive photoresist composition and formulations which improve the effective radiation absorption range in mid UV region at 300–350 nm.

It is another object of the present application to provide a positive photoresist composition and formulations which exhibit a higher degree of resolution and are applicable in the manufacturing of VLSI as micro-image production material.

These and other objects and features of the photoresist compositions according to the present invention will be more fully understood and appreciated by reference to the following description and appended drawings.

DETAILED DESCRIPTION OF THE INVENTION

In the present preferred embodiment, the photoresist compositions comprise an ester of spiroglycol and 1-oxo-2-diazon apthlene-5-sulfonic acid chloride or 5,5-diester, represented by the formula:

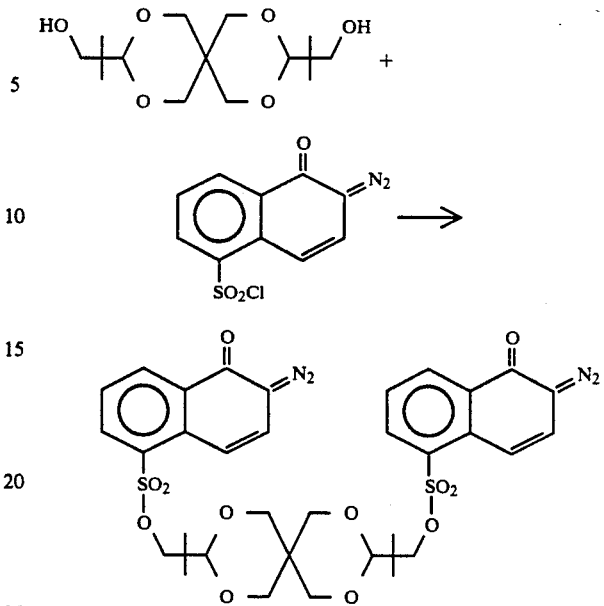

The above novel product is prepared by the reaction of the above-mentioned reactants in the presence of dioxane, pyridine, and triethyamine, as illustrated below:

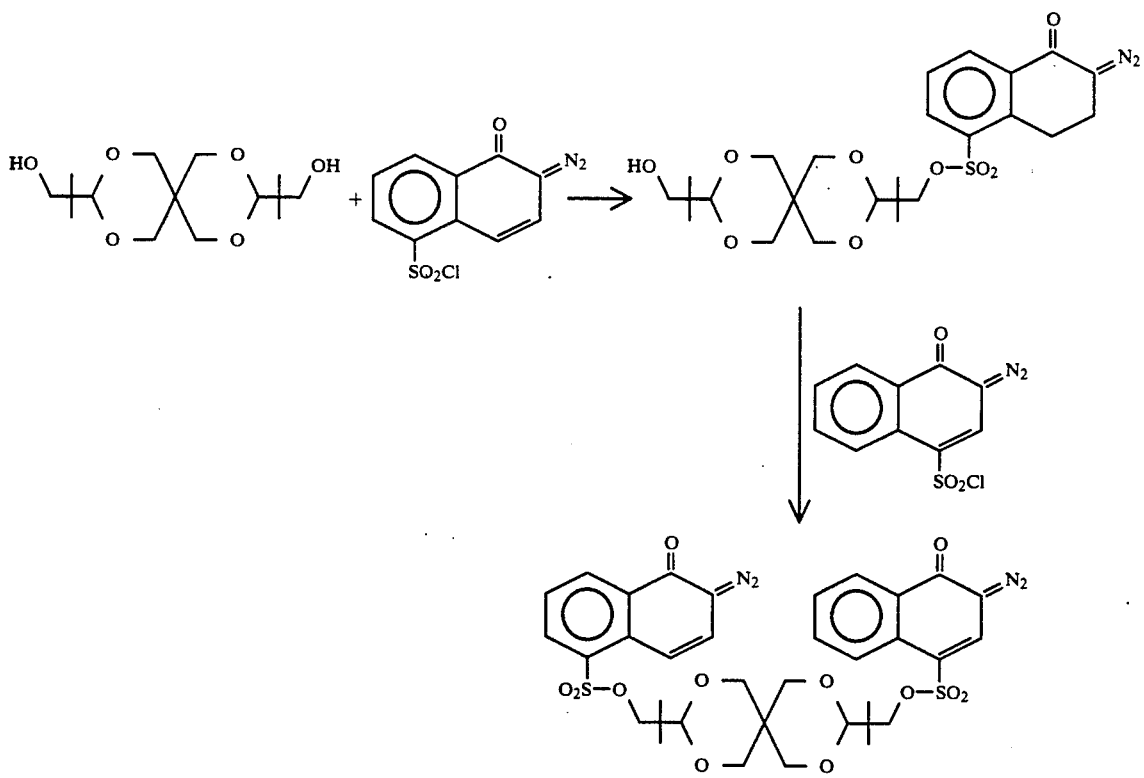

The methods are (1) the reaction of spiroglycol and 1-oxo-2-diazonapthalene-4-sulfonic acid chloride to form 4,4-diester, or (2) the reaction of equal moles of 5-diazonapthalene and spiroglycol followed by reaction of the half ester with equal moles of 4-diazonapthalene to form 4,5-diester, or (3) the blending of 4,4-diester and 5,5-diester can also be used to achieve the same efficiency.

In the preferred embodiment according to the present application, the photoresist composition comprises of the following components. Unless otherwise indicated, all parts and percentages are based on the weight of the solvent used.

Novolak: 10 to 85%, preferably 25 to 55%,
photosensitizer: 0.5 to 50%, preferably 5 to 30%, A suitable solvent used for the composition of the present invention is selected from the group consisting of 2-ethoxyethyl acetate, cyclopentanone, n-hexanol, N-methylpyrrolidone, dimethyl sulfoxide. About 10 to 1000ppm of surfactant can be added to the above composition if desired.

The above components are mixed and stirred for 6 to 12 hours until the components are thoroughly dissolved, and the resultant solution is passed through 0.2 um Millipore teflon filters. The photoresist composition is then coated on silicon wafer which are then placed in a convection oven and baked at 80° to 110° C. for 30 minutes. The film thus obtained has a thickness of 1.0 to 1.5 um. After exposing the film in a suitable dosage of UV radiation and developing the film in 1% KOH solution, images of 1.0 to 5.0 um width is shown.

Figure 2:
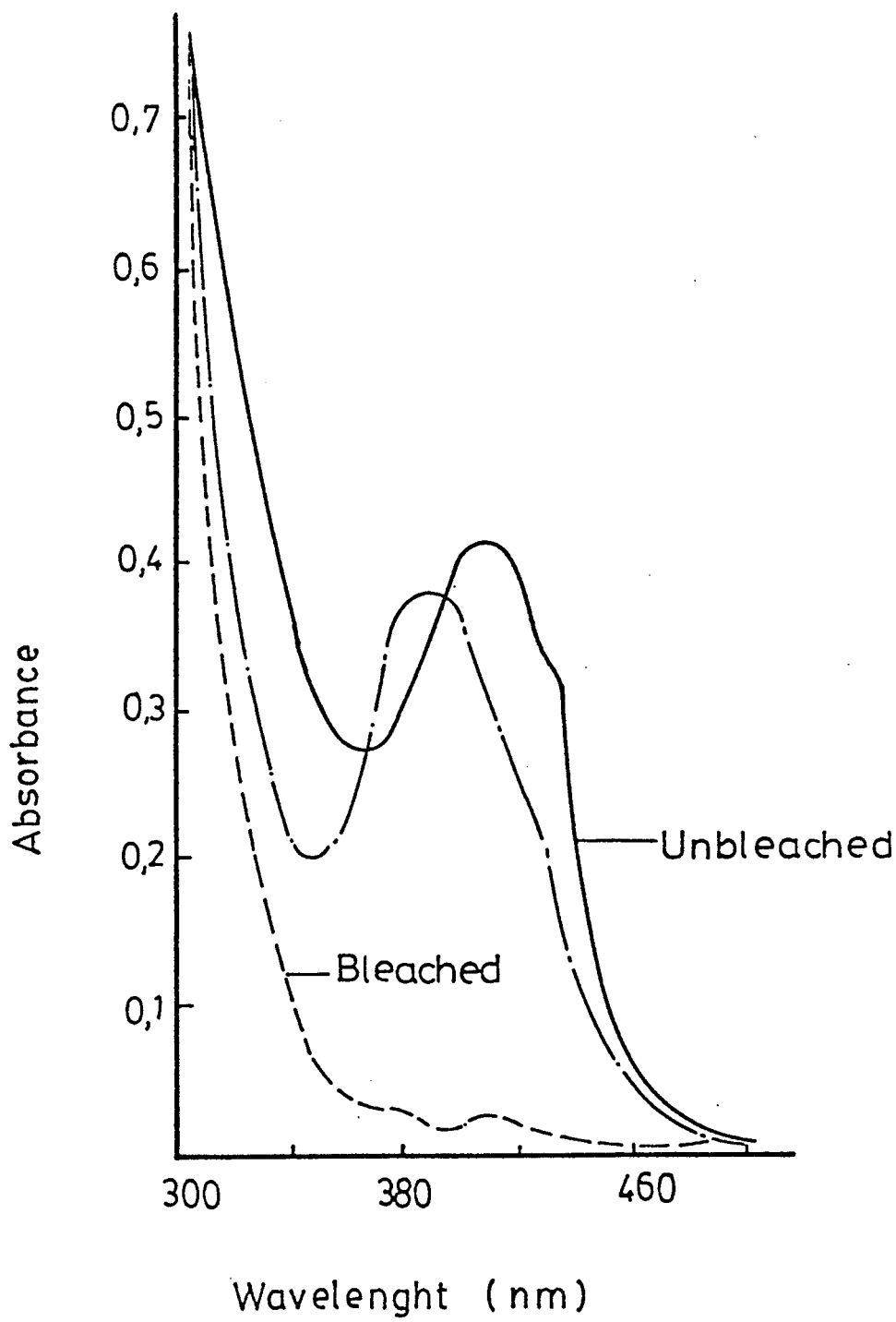
FIG. 2 shows the absorption spectrum for 5,5-diesters and 4,4-di-esters before and after photo bleaching.

If the photoresist composition is coated on quartz and then placed in a convection oven and baked at 100° C. for about 30 minutes, a 1.0 um thick film is obtained. The film is exposed with near UV wavelengths radiation and the absorption spectrum is determined with an UV spectrometer and the results are plotted as shown in FIG. 2.

Examples

EXAMPLE 1

Preparation of 5,5-di-ester Photosensitizer

To a 500 cc reactor, 6.3 grams of spiroglycol, 0.5 grams of pyridine, 100 ml of triethylamine and 200 ml of dioxane were charged. When the solution was heated to 50° C., 120 ml of dioxane containing 17.0 g of 1-oxo-2-diazonaphthalene-5-sulfonic acid chloride was added slowly with stirring. The solution was kept at a temperature of 50° C. for 2 hours. By means of a rotary evaporator, the solution thus obtained was evaporated until 40 to 60 ml of the solution was left. 550 ml of a 3-N hydrochloric acid solution was then added. The product was then precipitated, washed with water, and dried in a 50° C. oven. The final yellowish product thus obtained was 5.5-diester, and weighed 15.3 grams, yield: 95.8%.

Other Photosensitizers, 4,4-diester and 4,5-diester, can also be obtained by similar method.

EXAMPLE 2

Formulations of Photoresists

The formulation of a photoresist was as follows:
Novolak Resin: 2.8 g
cyclopentanone: 6.4 g
N-methylpyrrolidone: 2.4 g
5,5-diester: 0.65 g
Surfactant: 0.028 g These components were charged into a flask, stirred for 12 hours to make them thoroughly dissolved.

EXAMPLE 3

After the photoresist compositions obtained from Example 2 was filtered by Millipore 0.2 um membrane and spin coated on silicon wafers (spin coater was made by Head-way Research Inc.), the coating was baked at 100° C. for 30 minutes in a convection oven. The film of coating was then masked, and exposed to radiation of conventional wavelength (300–500 nm by a proximity exposure station made by Microtech Co.,) for 25 seconds and developed in a 1% KOH solution for 30 seconds at 23° C. It was then rinsed with water and dried in air. The film thickness was measured by a Tally step (Rank Taylor Hobson Co.,) to be about 1.0 um, and examined under a microscope. A 5.0 um of line width pattern was clearly observed.

EXAMPLE 4

The procedures in Example 3 above were repeated using an exposure wavelength in the mid-UV region (280–340nm Karl Suss MJB 3UV 300 contact printer). The exposure time was 75 seconds and the film was immersed in 1 % KOH solution for 50 seconds at 23° C. Under a microscope, a 1.0 um of line width pattern was clearly observed.

Figure 1:
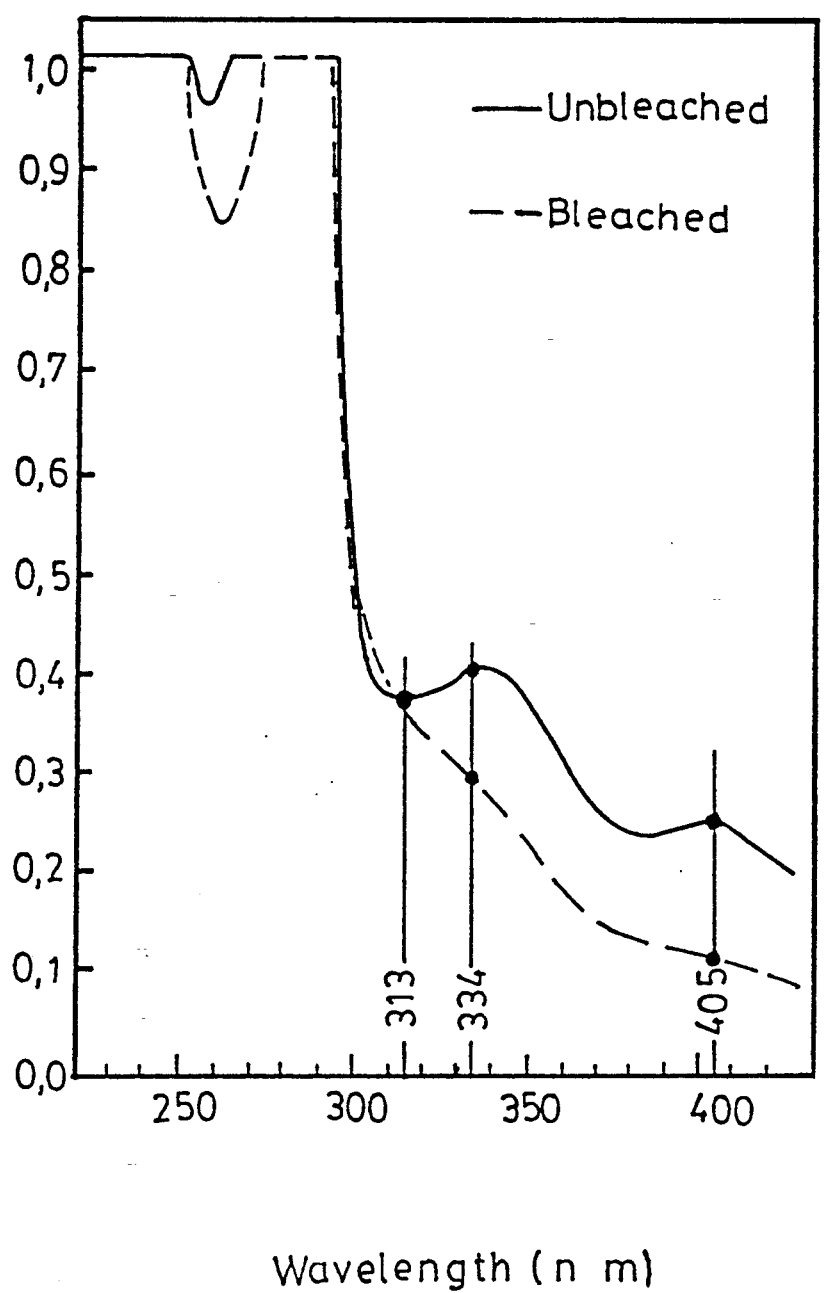
FIG. 1 shows the absorption spectrum for conventional photoresist composition (AZ 1350 J)

FIG. 2 illustrates that the photoresist compositions with diesters as photosensitizer is effective in the mid-UV range and in the near UV range. When compared with that of the prior art in FIG. 1, which shows considerable absorption, it is rather obvious that the present photoresist compositions provide a higher degree of resolution.

To distinguish the differences between the present photoresist of the present invention with that of the conventional, AZ 1350J photoresist was used in the preparation in Example 3. It was found out that more than 140 sec was required to attain the same level of resolution (1 um line width). Silicon chips having circuitry pattern as prepared in Example 3 was hard baked at 130° C. for 30 mins, followed by deep UV radiation. It was determined that the chips withstood 200° C. without distortion. Thus, it proved that the photoresist in accordance with the present invention possesses excellent thermal stability.

It is to be understood that the present invention is merely a preferred embodiment and that variations and changes can be made without departing from the spirit and the aspects thereof as set forth in the appended claims.

What is claimed is:

1. A photoresist composition comprising:
   (a) a solvent;
   (b) a resin matrix, of from about 10 to about 85 weight %, based on the weight of the solvent;
   (c) a photosensitizer, of from about 0.5 to about 50 weight %, based on the weight of the solvent, said photosensitizer selected from the group consisting of the 5,5-diester of spiroglycol and 1-oxo-2-diazonaphthalene-5-sulfonic acid chloride, the 4,4-diester of spiroglycol and 1-oxo-2-diazonaphthalene, the 4,5-diester of spiroglycol and 1-oxo-2-diazonaphthalene and mixtures thereof; and
   (d) a surfactant, of from about 10 to about 1000 ppm of the total weight of components (a) to (c).

2. The photoresist composition as set forth in claim 1, wherein the resin matrix is a novolak resin present in a concentration of from about 25 to about 55 weight %, based on the weight of the solvent.

3. The photoresist composition as set forth in claim 1, wherein the photosensitizer is the 5,5-diester of spiroglycol and 1-oxo-2-diazonaphthalene-5-sulfonic acid chloride present in a concentration of from about 5 to about 30 weight %, based on the weight of the solvent.

4. The photoresist composition as set forth in claim 1, wherein the photosensitizer is the 4,4-diester of spiroglycol and 1-oxo-2-diazonaphthalene-5-sulfonic acid chloride present in a concentration of from about 5 to about 30 weight %, based on the weight of the solvent.

5. The photoresist composition as set forth in claim 1, wherein the photosensitizer is the 4,5-diester of spiroglycol and 1-oxo-2-diazonaphthalene-5-sulfonic acid chloride present in a concentration of from about 5 to about 30 weight %, based on the weight of the solvent.

6. The photoresist composition as set forth in claim 1, wherein the photosensitizer is a mixture of the 4,4-diester and the 5,5-diester of spiroglycol and 1-oxo-2-diazonaphthalene-5-sulfonic acid chloride, said photosensitizer present in a concentration of from about 5 to about 30 weight %, based on the weight of the solvent.

7. The photoresist composition as set forth in claim 1, wherein the solvent is selected from the group consisting of 2-ethoxyethyl acetate, cyclopentanone, n-hexanol, N-methyl pyrrolidone, dimethyl sulfoxide and mixtures thereof.

* * * * *

UNITED STATES PATENT AND TRADEMARK OFFICE
CERTIFICATE OF CORRECTION

PATENT NO. : 5,075,194

DATED : December 24, 1991

INVENTOR(S) : Jong-Min Liu, et al.

Page 1 of 2

It is certified that error appears in the above-identified patent and that said Letters Patent is hereby corrected as shown below:

Title Page:
In the Abstract, line 4: "on" should read as --or--

In the Drawings, Sheet 1: "  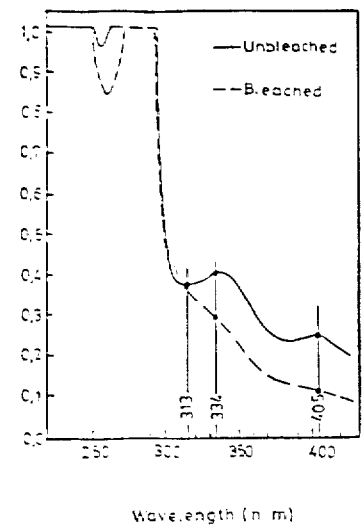  "

should read as

UNITED STATES PATENT AND TRADEMARK OFFICE
CERTIFICATE OF CORRECTION

PATENT NO. : 5,075,194

DATED : December 24, 1991

INVENTOR(S) : Jong-Min Liu, et al.

It is certified that error appears in the above-identified patent and that said Letters Patent is hereby corrected as shown below:

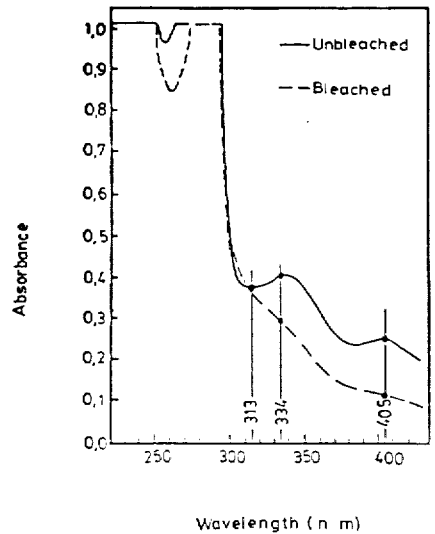

FIG. 1

Signed and Sealed this

Sixth Day of July, 1993

Attest:

MICHAEL K. KIRK

Attesting Officer

Acting Commissioner of Patents and Trademarks